United States Patent
Liu

(10) Patent No.: US 7,777,546 B2
(45) Date of Patent: Aug. 17, 2010

(54) DC OFFSET CALIBRATION APPARATUS AND METHOD FOR DIFFERENTIAL SIGNALS

(75) Inventor: Ren-Chieh Liu, Chang-Hua Hsien (TW)

(73) Assignee: Realtek Semiconductor Corp., Science Park, HsinChu (TW)

( * ) Notice: Subject to any disclaimer, the term of this patent is extended or adjusted under 35 U.S.C. 154(b) by 2 days.

(21) Appl. No.: 11/968,623

(22) Filed: Jan. 2, 2008

(65) Prior Publication Data
US 2008/0157847 A1    Jul. 3, 2008

(30) Foreign Application Priority Data
Jan. 3, 2007   (TW) .............. 96100219 A

(51) Int. Cl.
*H03L 5/00* (2006.01)
(52) U.S. Cl. ...................... 327/307; 327/362
(58) Field of Classification Search ......... 327/306–307, 327/362, 315–317; 330/260, 252
See application file for complete search history.

(56) References Cited

U.S. PATENT DOCUMENTS

| 5,798,664 | A  | * | 8/1998 | Nagahori et al. ........... 327/307 |
| 6,047,031 | A  | * | 4/2000 | Allott et al. ............... 375/317 |
| 6,211,716 | B1 |   | 4/2001 | Nguyen |
| 6,316,992 | B1 |   | 11/2001 | Miao |
| 6,903,593 | B2 | * | 6/2005 | Wang ...................... 327/307 |
| 6,937,081 | B2 |   | 8/2005 | Ishikawa |
| 6,941,121 | B2 |   | 9/2005 | Chen |
| 2003/0184459 | A1 |   | 10/2003 | Engl |

(Continued)

FOREIGN PATENT DOCUMENTS

JP   2-246604   10/1990

(Continued)

OTHER PUBLICATIONS

A Single-Chip Direct-Sequence Spread-Spectrum CMOS Transceiver for High Performance, Low Cost 2.4-GHz Cordless Applications, Proceedings IEEE Asian Solid-State Circuits Conference Technical Papers, pp. 253-256, Hsinchu, Taiwan, Nov. 2005.

(Continued)

*Primary Examiner*—Dinh T. Le
(74) *Attorney, Agent, or Firm*—Winston Hsu

(57) ABSTRACT

A DC offset calibration apparatus includes a first adjustment unit, a first offset calibration circuit, a second adjustment unit, and a second offset calibration circuit. The first adjustment unit adjusts a first input signal to generate a first output signal according to a first offset calibration signal. The first offset calibration circuit is coupled to the first output signal and the first adjustment unit for determining the first offset calibration signal according to the first output signal and predetermined threshold value. The second adjustment unit adjusts a second input signal to generate a second output signal according to a second offset calibration signal. The second offset calibration circuit is coupled to the second output signal and the second adjustment unit for determining the second offset calibration signal according to the second output signal and the predetermined threshold value. The first and the second input signals are a differential signal pair.

27 Claims, 10 Drawing Sheets

U.S. PATENT DOCUMENTS

2003/0206054 A1    11/2003    Jin

FOREIGN PATENT DOCUMENTS

| | | | |
|---|---|---|---|
| JP | 2006063708 | * | 9/2007 |
| TW | 516265 | | 1/2003 |
| TW | I229505 | | 3/2005 |

OTHER PUBLICATIONS

5-GHz CMOS Radio Transceiver Front-End Chipset, IEEE Journal of Solid-State Circuits, pp. 1927-1933, vol. 35, No. 12, Dec. 2000.

A 2-V CMOS Cellular Transceiver Front-End, IEEE Journal of Solid-State Circuits, pp. 1895-1907, vol. 35, No. 12, Dec. 2000.

* cited by examiner

DC OFFSET CALIBRATION APPARATUS AND METHOD FOR DIFFERENTIAL SIGNALS

BACKGROUND OF THE INVENTION

1. Field of the Invention

The present invention relates to DC offset calibration technology, and more particularly, to a calibration apparatus and related method, which calibrates DC level of a signal through comparing said signal value and a predetermined threshold value.

2. Description of the Prior Art

Generally speaking, in order to adjust DC offsets resulted from channel effects, manufacturing process variations, power supply voltage variations, temperature variations, or other reasons so that the varying range of the received signals falls within a dynamic range of later-stage circuitry (such as an analog-to-digital converter) and signal distortion due to saturation can be avoided, a DC offset calibration mechanism is designed into receiving ends of communication systems or other systems having this need.

DC offset calibration apparatuses can be divided into two categories, which are on-line calibration and off-line calibration. The on-line DC offset calibration mechanism usually directly utilizes AC coupling to on-the-fly eliminate the DC offset of input signals or utilizes loop controls to eliminate the DC offset of the input signals by way of feedback. However, this mechanism will result in a slow response speed towards change in DC level of the input signals, mainly due to large time constant of resistor and capacitor components. On the other hand, the off-line DC offset calibration mechanism determines an adjustment amount for eliminating the DC offset in advance when the system is off-line, and utilizes the adjustment amount to eliminate the DC offset of the input signals when the system is on-line. However, just because the adjustment is determined off-line, it can hardly timely reflect the real-time change of the DC level of the input signals, so as to dynamically change the adjustment amount. Moreover, in practice the above-mentioned two mechanisms need to detect the DC offset of the input signals across a relatively long time period, in order to obtain a statistical average adjustment amount of the DC offset; hence, the DC offset calibration speed will become even slower. If convergence of a closed loop is further involved, the time required for detecting the DC offset of the input signals will become even lengthened.

SUMMARY OF THE INVENTION

It is therefore one of the objectives of the present invention to provide a DC offset calibration apparatus applied to differential amplifier circuits, which can utilize a symmetrical characteristic of the peak amplitude to calibrate the DC offset of the differential signal pair when two input ends of the differential signal pair are signals having the maximum symmetrical amplitude.

According to an embodiment of the present invention, a DC offset calibration apparatus is disclosed. The DC offset calibration apparatus includes a first adjustment unit, a first offset calibration circuit, a second adjustment unit, and a second offset calibration circuit. The first adjustment unit is used for receiving a first input signal and a first offset calibration signal and for adjusting the first input signal to generate a first output signal according to the first offset calibration signal. The first offset calibration circuit is coupled to the first output signal and the first adjustment unit for determining the first offset calibration signal according to the first output signal and at least one predetermined threshold value. The second adjustment unit is used for receiving a second input signal and a second offset calibration signal and for adjusting the second input signal to generate a second output signal according to the second offset calibration signal. The second offset calibration circuit is coupled to the second output signal and to the second adjustment unit for determining the second offset calibration signal according to the second output signal and the predetermined threshold value. The first input signal and the second input signal are a differential signal pair.

According to an embodiment of the present invention, a DC offset calibration method is disclosed. The DC offset calibration method includes: receiving a first input signal and a first offset calibration signal and adjusting the first input signal to generate a first output signal according to the first offset calibration signal; determining the first offset calibration signal according to the first output signal and at least one predetermined threshold value; receiving a second input signal and a second offset calibration signal and adjusting the second input signal to generate a second output signal according to the second offset calibration signal; and determining the second offset calibration signal according to the second output signal and the predetermined threshold value. The first input signal and the second input signal are a differential signal pair.

According to another embodiment of the present invention, a DC offset calibration method is disclosed. The DC offset calibration method includes receiving a differential signal pair having a first input signal and a second input signal, adjusting a voltage level of the first input signal to generate a first output signal according to a first offset calibration signal, determining the first offset calibration signal according to a comparison result of the first output signal and a predetermined threshold value, adjusting a voltage level of the second input signal to generate a second output signal according to a second offset calibration signal, determining the second offset calibration signal according to a comparison result of the second output signal and the predetermined threshold value, and utilizing an amplifier circuit to deal with an output differential signal pair composed of the first output signal and the second output signal.

These and other objectives of the present invention will no doubt become obvious to those of ordinary skill in the art after reading the following detailed description of the preferred embodiment that is illustrated in the various figures and drawings.

DETAILED DESCRIPTION

Figure 3:
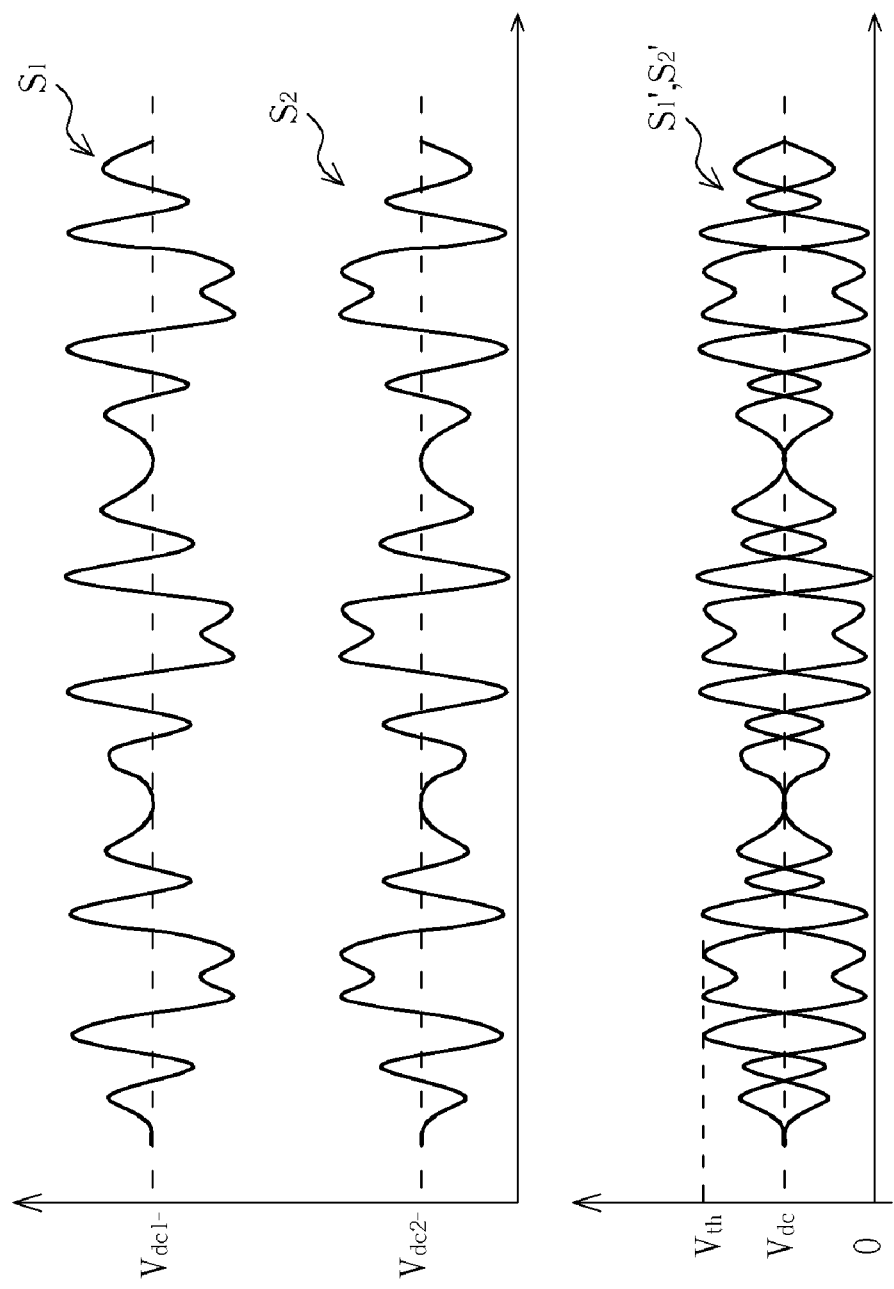
FIG. 3 is a waveform diagram of an example of the input signal and the output signal in FIG. 1.

For a differential signal pair, if it is provided with a characteristic of symmetrical peak amplitude or constant envelope (such as the preamble data of the OFDM signal in WLAN systems), then the goal of simultaneously calibrating the DC offset of the positive and negative ends of the differential signal can be achieved simply by simultaneously controlling the DC voltage levels of both the positive and the negative ends of the differential input signals are controlled to converge and become identical when designing the DC offset calibration mechanism. One example for illustrating the differential signal provided with the abovementioned characteristic of symmetrical peak amplitude or constant envelope is shown as the differential signal pair ($S_1$ and $S_2$) in FIG. 3, wherein $S_1$ and $S_2$ respectively represent the positive signal and the negative signal of the differential signal pair. As shown in FIG. 3, the peak amplitude of the positive signal $S_1$ (that is, a voltage difference between the peak value to the DC voltage level) is symmetrical to the peak amplitude of the negative signal $S_2$ (i.e., having the same magnitude but opposite in direction). Thus, as long as the DC voltage levels of the positive signal after calibration (such as $S_1'$ in FIG. 3) and the negative signal after calibration (such as $S_2'$ in FIG. 3) are adjusted and converged to an identical value (such as $V_{dc}$ in FIG. 3) when performing the DC offset calibration, it is then assured that when the DC offset calibration of one of the positive and negative signals satisfies the input range requirement of later-stage circuitry, the DC offset calibration of the other will satisfy, too.

Figure 1:
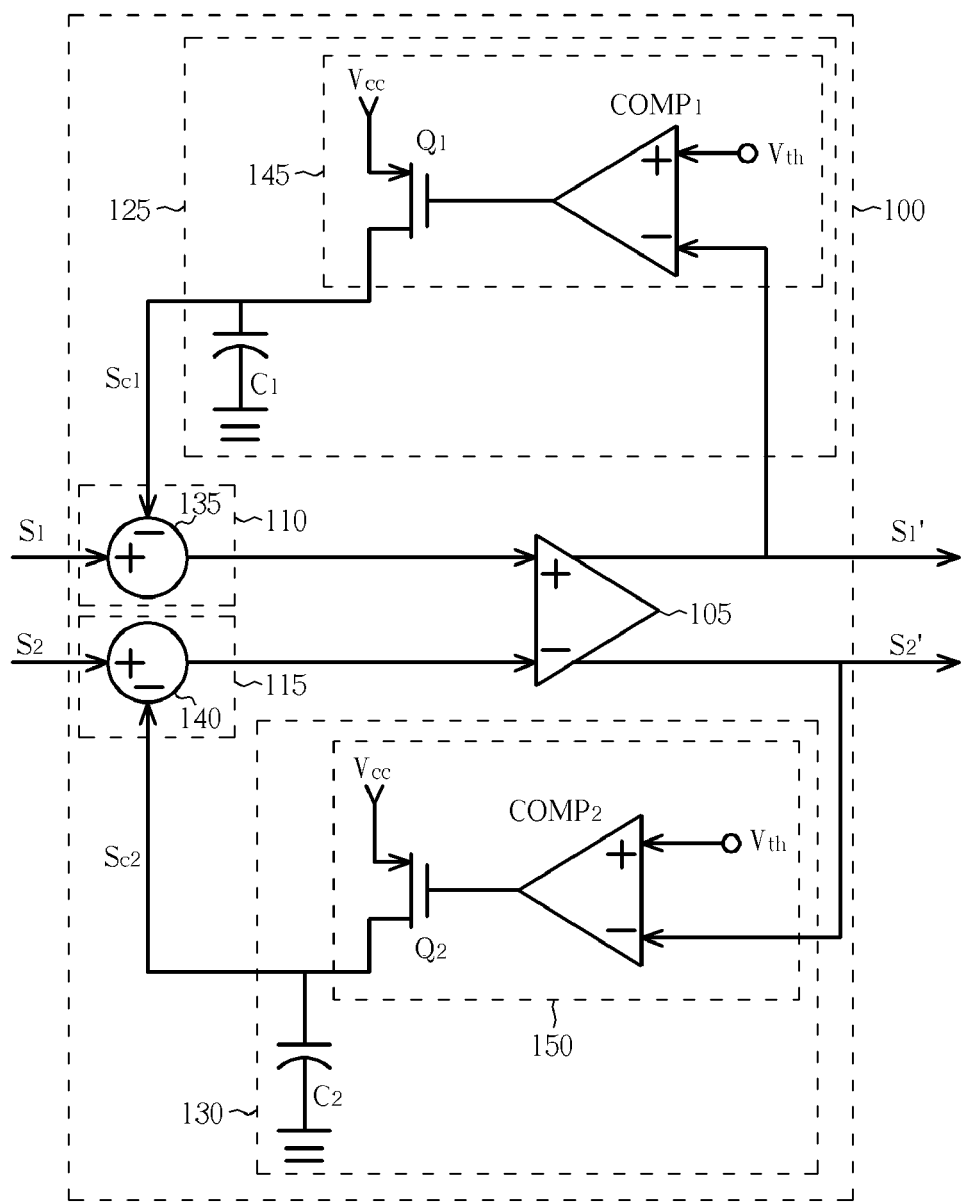
FIG. 1 is a diagram of a DC offset calibration apparatus according to a first embodiment of the present invention.

Please refer to FIG. 1. FIG. 1 is a diagram of a DC offset calibration apparatus 100 according to a first embodiment of the present invention. As shown in FIG. 1, the DC offset calibration apparatus 100 respectively calibrates input signals $S_1$ and $S_2$ (here assuming that the input signals $S_1$ and $S_2$ possess the characteristic of symmetrical peak amplitude or constant envelope), and DC offsets of a differential amplifier circuit 105 of the DC offset calibration apparatus 100 caused by manufacturing process mismatch, to generate output signals $S_1'$ and $S_2'$. The DC offset calibration apparatus 100 further includes adjustment units 110 and 115 (respectively implemented by using subtractors 135 and 140) and offset calibration circuits 125 and 130. The adjustment unit 110 adjusts a voltage level of the input signal $S_1$ according to a voltage level of a offset calibration signal $S_{c1}$, and then its adjusted output signal is amplified to generate the output signal $S_1'$. The adjustment unit 115 adjusts a voltage level of the input signal $S_2$ according to a voltage level of a offset calibration signal $S_{c2}$, and then its adjusted output signal is amplified to generate the output signal $S_2'$.

Besides, the offset calibration circuit 125 further includes a capacitor $C_1$ and a calibration circuit 145 having a transistor $Q_1$ and a comparator $COMP_1$, wherein the offset calibration circuit 125 is used for determining the voltage level of the offset calibration signal $S_{c1}$ according to the voltage level of the output signal $S_1'$ and a predetermined threshold value $V_{th}$. If the output signal $S_1'$ satisfies a first predetermined condition corresponding to the predetermined threshold value $V_{th}$, the offset calibration circuit 125 will use the comparator $COMP_1$ to control the turning on of the transistor $Q_1$, and the capacitor $C_1$ is then charged to adjust the offset calibration signal $S_{c1}$. At this time, a closed loop DC offset calibration mechanism is formed in the DC offset calibration apparatus 100 due to the transistor $Q_1$ being turned on. If the output signal $S_1'$ does not satisfy the first predetermined condition, the offset calibration circuit 125 will use the comparator $COMP_1$ to control the turning off of the transistor $Q_1$, and the offset calibration signal $S_{c1}$ is maintained by the offset calibration circuit 125. At this time, an open loop DC offset calibration mechanism is formed in the DC offset calibration apparatus 100. In addition, the offset calibration circuit 130 further includes a capacitor $C_2$ and a calibration circuit 150 having a transistor $Q_2$ and a comparator $COMP_2$, wherein the offset calibration circuit 130 is used for determining the voltage level of the offset calibration signal $S_{c2}$ according to the voltage level of the output signal $S_2'$ and the predetermined threshold value $V_{th}$. If the output signal $S_2'$ satisfies a second predetermined condition corresponding to the predetermined threshold value $V_{th}$, the offset calibration circuit 130 will use the comparator $COMP_2$ to control the turning on of the transistor $Q_2$, and the capacitor $C_2$ is then charged to adjust the offset calibration signal $S_{c2}$. On the other hand, the offset calibration circuit 130 will maintain the offset calibration signal $S_{c2}$ if the output signal $S_2'$ does not satisfy the second predetermined condition.

As abovementioned, the predetermined threshold value $V_{th}$ is a predetermined threshold voltage level, the first predetermined condition is that the voltage level of the output signal $S_1'$ exceeds the predetermined threshold voltage level $V_{th}$, and the second predetermined condition is that the voltage level of the output signal $S_2'$ exceeds the predetermined threshold voltage level $V_{th}$. Hence, if the first predetermined condition is satisfied, the comparator $COMP_1$ will output a control signal of low logic level for turning on the transistor $Q_1$. A power source $V_{cc}$ will charge the capacitor $C_1$ through the transistor $Q_1$, thus the voltage level of the offset calibration signal $S_{c1}$ will be raised by the charging of the capacitor $C_1$. The voltage level of the input signal $S_1$ will be lowered to generate the output signal $S_1'$ through the subtractor 135. For this reason, a maximum value of the voltage level of the output signal $S_1'$ is confined by the predetermined threshold voltage value $V_{th}$. Similarly, if the second condition is satisfied, the operation of the offset calibration circuit 130 is the same as the operation of the offset calibration circuit 125. The comparator $COMP_2$ will output a control signal of low logic level for turning on the transistor $Q_2$. The power source $V_{cc}$ will charge the capacitor $C_2$ through the transistor $Q_2$, thus the voltage level of the offset calibration signal $S_{c2}$ will be raised by the charging of the capacitor $C_2$. The voltage level of the input signal $S_2$ will be lowered to generate the output signal $S_2'$ through the subtractor 140. For this reason, a maximum value of the voltage level of the output signal $S_2'$ is confined by the predetermined threshold voltage value $V_{th}$. Due to the input signals $S_1$ and $S_2$ having a characteristic of symmetrical peak amplitude or constant envelope, the DC offsets of both the input signal $S_1$ and $S_2$ tend to become the same value through a specific control mechanism. Therefore, an objective for simultaneously completing DC offset calibrations of the signals $S_1$ and $S_2$ can be reached. Therefore for later-stage circuitry (such as an analog-to-digital converter, not shown in FIG. 1), if the value of the predetermined threshold voltage value $V_{th}$ is designed to be smaller than the dynamic range of its input ends, a signal saturation phenomenon will not be observed in the DC offset of the input ends.

Figure 2:
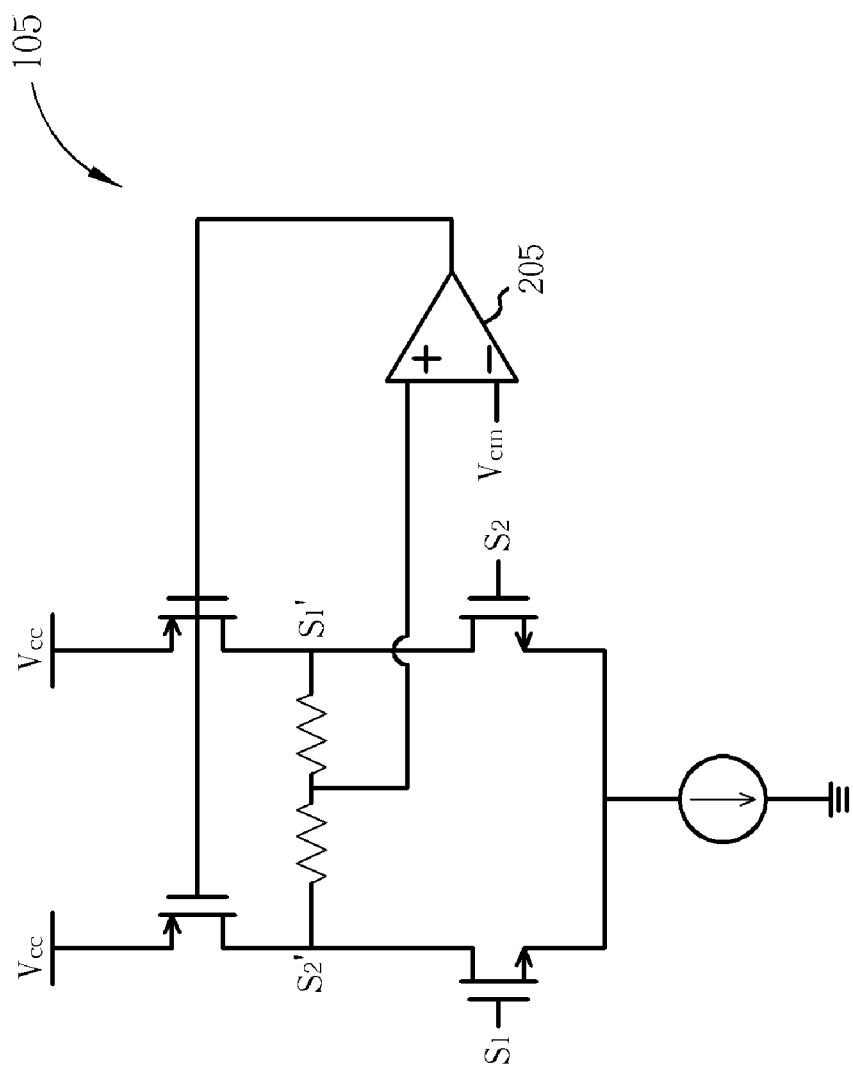
FIG. 2 is a diagram of an embodiment of the differential amplifier circuit shown in FIG. 1.

Please refer to FIG. 2. FIG. 2 is a diagram of an embodiment of the differential amplifier circuit 105 shown in FIG. 1. FIG. 2 shows a typical differential amplifier circuit, which is composed of a plurality of active elements, such as transistors, to respectively constitute its gain stage and its loading.

The implementation and operating principle of such a differential amplifier are well known by those skilled in the art and are therefore not described herein in further detail. Please note that, the differential amplifier circuit 105 further includes a common-mode feedback path coupled between the output end and the input end, for constraining a common-mode voltage (that is, the DC voltage level) of the positive and the negative signals of the output ends to a reference common-mode voltage $V_{cm}$. In this embodiment, the common-mode feedback path is composed of two resistors and one comparator 205 that are coupled to the output ends, wherein the comparator 205 controls two active loadings according to a midpoint voltage of the two resistors and the reference common-mode voltage $V_{cm}$. Through the common-mode feedback mechanism described above, the DC level of the two output signals $S_1'$ and $S_2'$ converge and tend to become identical. In addition, due to the differential signal to be processed having a characteristic of symmetrical peak amplitude or constant envelope, when one of the output signals $S_1'$ and $S_2'$ is DC offset calibrated by the offset calibration circuits 125 or 130, calibration of the other output signal to the same degree will be warranted. The result for the abovementioned DC offset calibration is referred to in FIG. 3, wherein the waveform shown in the upper half illustrates the input signals $S_1$ and $S_2$ before calibration, which respectively have different DC voltage levels $V_{dc1}$ and $V_{dc2}$, and the waveform shown in the lower half illustrates the output signals $S_1'$ and $S_2'$ after calibration, which have the same DC voltage levels $V_{dc}$. At this time, if one of the output signals $S_1'$ and $S_2'$ (such as the output signal $S_1'$) is calibrated by the offset calibration circuit 125 to have a peak value smaller than the predetermined threshold value $V_{th}$, the other output signal (such as the output signal $S_2'$) will be similarly calibrated to have a peak value smaller than the predetermined threshold value $V_{th}$ through the operation of the common-mode feedback path in conjunction with the characteristic of maximum symmetrical amplitude or constant envelope.

Figure 4:
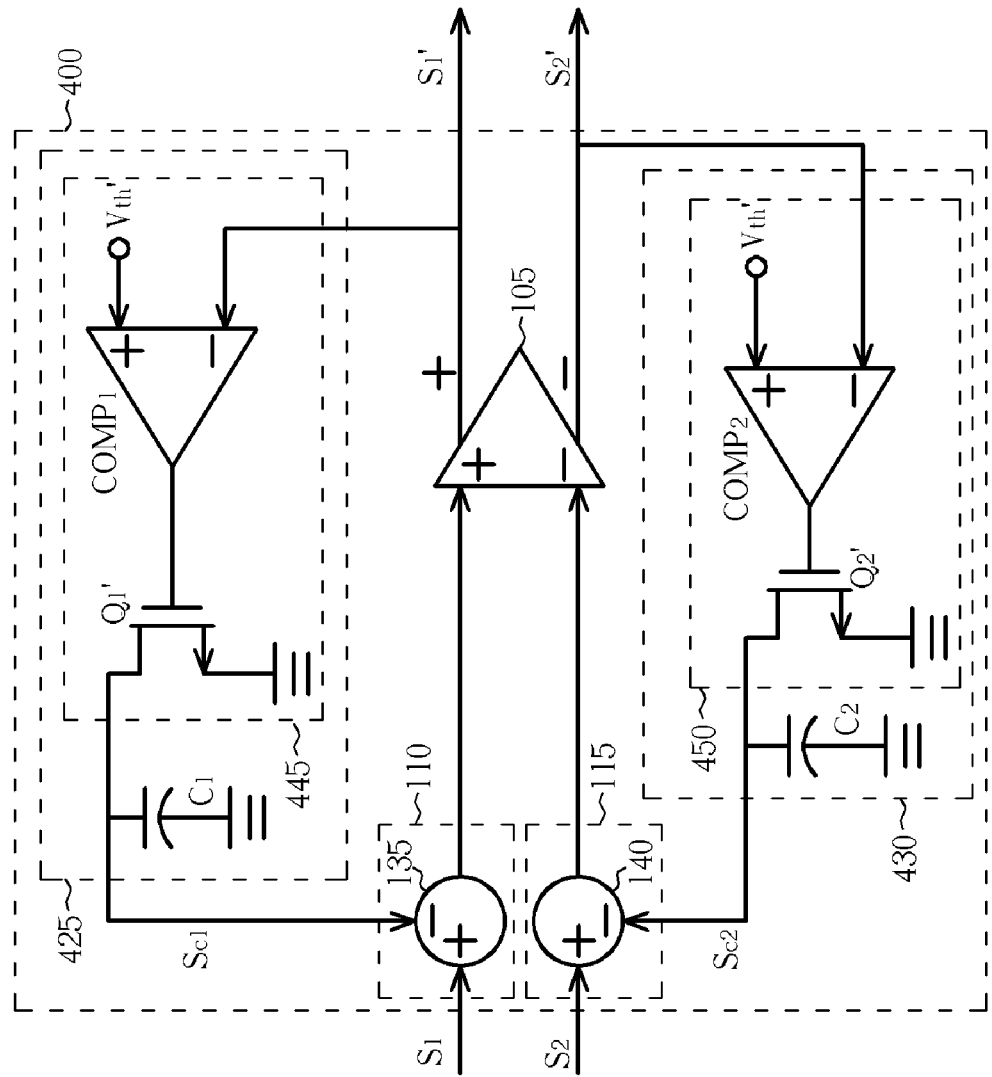
FIG. 4 is a diagram of a DC offset calibration apparatus according to a second embodiment of the present invention.

Furthermore, by confining the minimum amplitude of two differential output signals (that is, the peak value in the other direction) to the same predetermined threshold voltage level, the objective of calibrating to the same DC offset level can also be achieved. Please refer to FIG. 4. FIG. 4 is a diagram of a DC offset calibration apparatus 400 according to a second embodiment of the present invention. The major difference between the DC offset calibration apparatuses 100 and 400 is that, instead of utilizing the power resource $V_{cc}$ to perform charging in calibrating the differential output signals $S_1'$ and $S_2'$ to the same DC offset levels, the DC offset calibration apparatus 400, according to a predetermined threshold voltage level $V_{th}'$, utilizes respectively the comparators $COMP_1$, $COMP_2$ and the capacitors $C_1$, $C_2$ of the offset calibration circuits 425 and 430 to perform discharging through transistors $Q_1'$ and $Q_2'$ to ground. If a first predetermined condition is satisfied; that is, the voltage level of the output signal $S_1'$ is smaller than the predetermined threshold voltage level $V_{th}'$, the comparator $COMP_1$ will output a control signal of high logic level to turn on the transistor $Q_1'$. The capacitor $C_1$ will then be discharged to ground through the transistor $Q_1'$, thus the voltage level of the offset calibration signal $S_{c1}$ will be lowered by the discharging of the capacitor $C_1$. Consequently, the voltage level of the input signal $S_1$ will be raised to generate the output signal $S_1'$. For this reason, a lowest voltage level of the output signal $S_1'$ will be confined by the predetermined threshold voltage value $V_{th}'$. Similarly, if a second condition is satisfied; that is, the voltage level of the output signal $S_2'$ is smaller than the predetermined threshold voltage level $V_{th}'$. The capacitor $C_2$ will then be discharged to ground through the transistor $Q_2'$, thus the voltage level of the offset calibration signal $S_{c2}$ will be lowered by the discharging of the capacitor $C_2$. Consequently, the voltage level of the input signal $S_2$ will be raised to generate the output signal $S_2'$. For this reason, a lowest voltage level of the output signal $S_2'$ will be confined by the predetermined threshold voltage value $V_{th}'$. As abovementioned, the lowest voltage levels of the output signals $S_1'$ and $S_2'$ are confined by the same predetermined threshold voltage value $V_{th}'$. Similarly, the DC offset calibration apparatus 400 of this embodiment will co-operate with the differential amplifier circuit 105 having the common-mode feedback path in FIG. 2, to ensure that both the positive signal and the negative signal are calibrated appropriately. Hence, at later-stage circuitry (not shown in FIG. 4) a signal saturation phenomenon due to DC offset will not be observed even when the signals are amplified.

Figure 5:
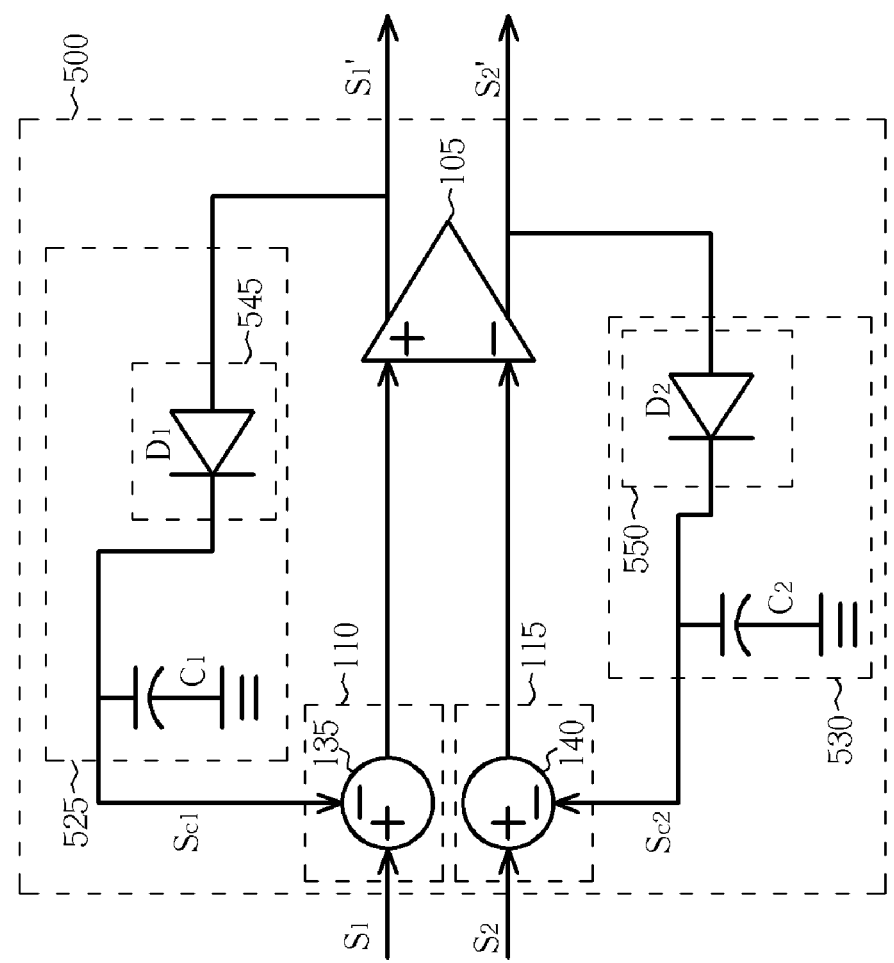
FIG. 5 is a diagram of a DC offset calibration apparatus according to a third embodiment of the present invention.

Please refer to FIG. 5. FIG. 5 is a diagram of a DC offset calibration apparatus 500 according to a third embodiment of the present invention. The DC offset calibration apparatus 500 utilizes respectively the voltage levels of the output signals $S_1'$ and $S_2'$, the offset calibration signals $S_{c1}$ and $S_{c2}$, and a predetermined threshold value $V_D$, to which the diode units (for easy illustration, two diodes $D_1$ and $D_2$ are used for representing the diode units) of the calibration circuits 545 and 550 correspond, for determining the voltage levels of the offset calibration signals $S_{c1}$ and $S_{c2}$, wherein the predetermined threshold value $V_D$ is a predetermined threshold voltage difference in this embodiment. When the output signal $S_1'$ satisfies a first predetermined condition corresponding to the predetermined threshold voltage difference $V_D$ (in this embodiment, the first predetermined condition is that a voltage difference between the output signal $S_1'$ and the offset calibration signal $S_{c1}$ reaches the predetermined threshold voltage difference $V_D$), the offset calibration circuit 525 adjusts the offset calibration signal $S_{c1}$; otherwise, the offset calibration circuit 525 maintains the offset calibration signal $S_{c1}$. Similarly, when the output signal $S_2'$ satisfies a second predetermined condition of the predetermined threshold voltage difference $V_D$ (in this embodiment, the second predetermined condition is that a voltage difference between the output signal $S_2'$ and the offset calibration signal $S_{c2}$ reaches the predetermined threshold voltage difference $V_D$), the offset calibration circuit 530 adjusts the offset calibration signal $S_{c2}$; otherwise, the offset calibration circuit 530 maintains the offset calibration signal $S_{c2}$.

The predetermined voltage difference $V_D$ represents a minimum bias voltage for the diodes $D_1$ and $D_2$ to be forward conducted, which is actually the turn-on voltage (here assuming that their bias voltages are identical). In other words, when the voltage level of the output signal $S_1'$ is greater than the voltage level of the offset calibration signal $S_{c1}$ and reaches the predetermined threshold voltage difference $V_D$, the diode $D_1$ will become conducted and the output signal $S_1'$ will start charging the capacitor $C_1$ through the diode $D_1$ and raise the voltage level of the offset calibration signal $S_1$. Similarly, when the voltage level of the output signal $S_2'$ is greater than the voltage level of the offset calibration signal $S_{c2}$ and reaches the predetermined threshold voltage difference $V_D$, the diode $D_2$ will become conducted and the output signal $S_2'$ will start charging the capacitor $C_2$ through the conducted diode $D_2$ and raise the voltage level of the offset calibration signal $S_{c2}$. Likewise, the DC offset calibration apparatus 500 of this embodiment will co-operate with the differential amplifier circuit 105 having the common-mode feedback path in FIG. 2 to ensure that both the positive signal and the negative signal are calibrated appropriately. Hence, an erroneous operation will not be observed at later-stage circuitry.

Figure 6:
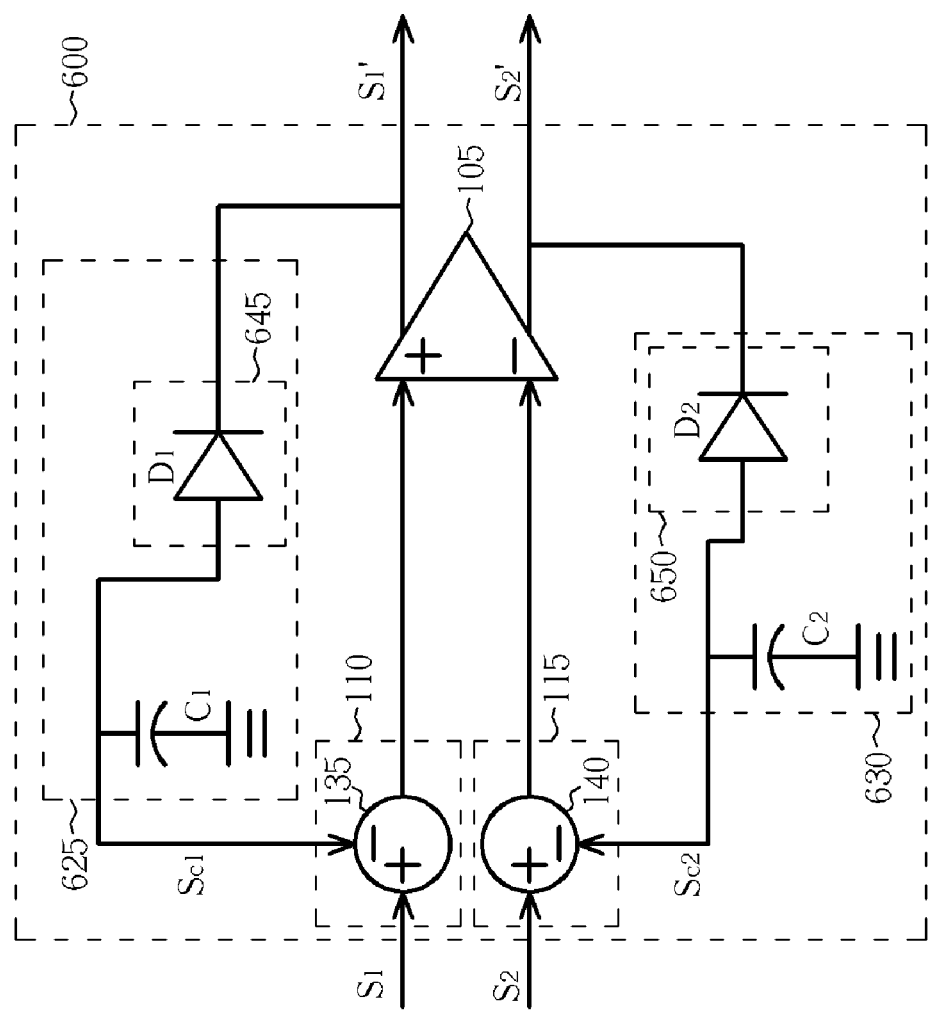
FIG. 6 is a diagram of a DC offset calibration apparatus according to a fourth embodiment of the present invention.
Figure 7:
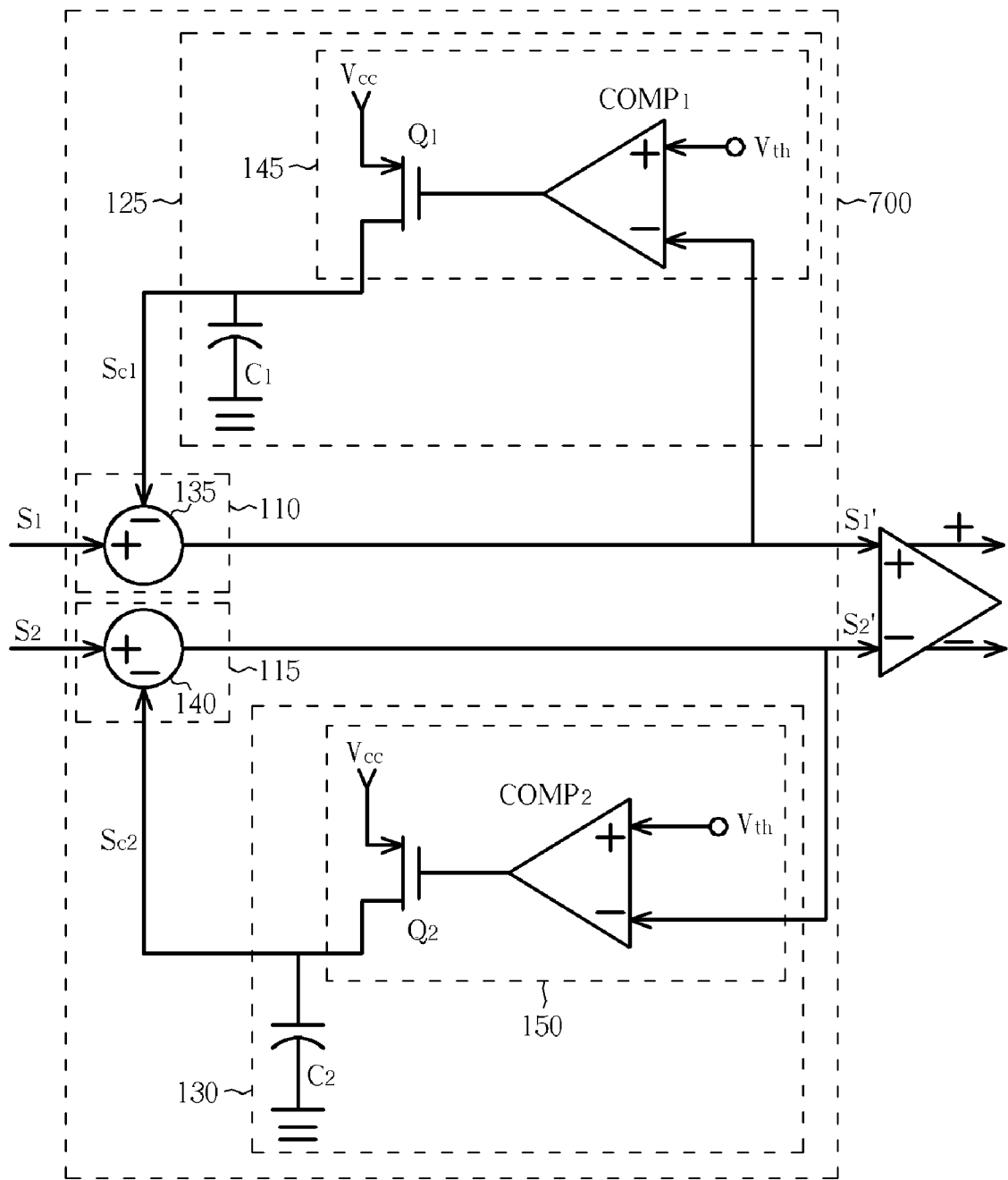
FIG. 7 is a diagram of a DC offset calibration apparatus according to a fifth embodiment of the present invention.
Figure 8:
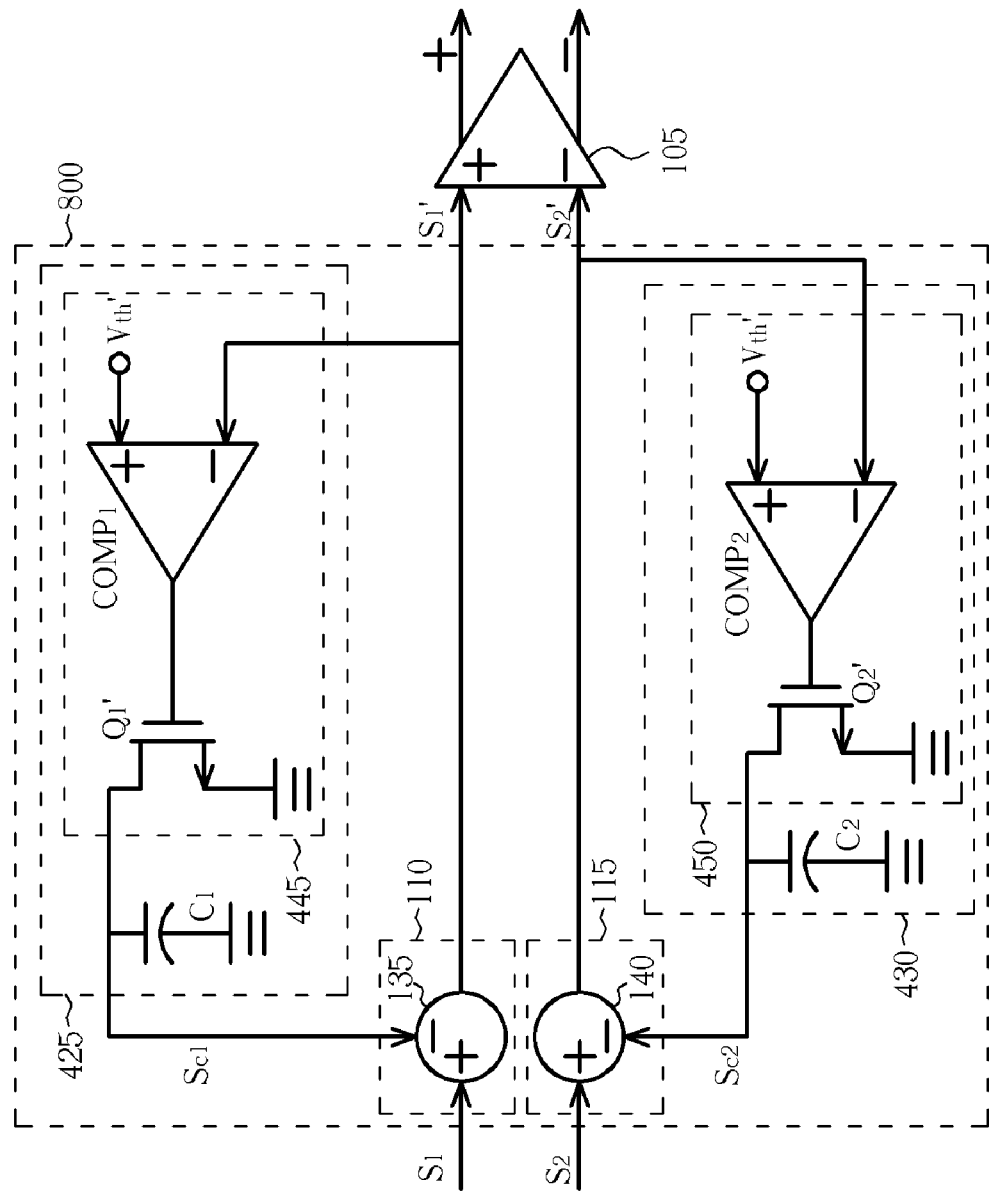
FIG. 8 is a diagram of a DC offset calibration apparatus according to a sixth embodiment of the present invention.
Figure 9:
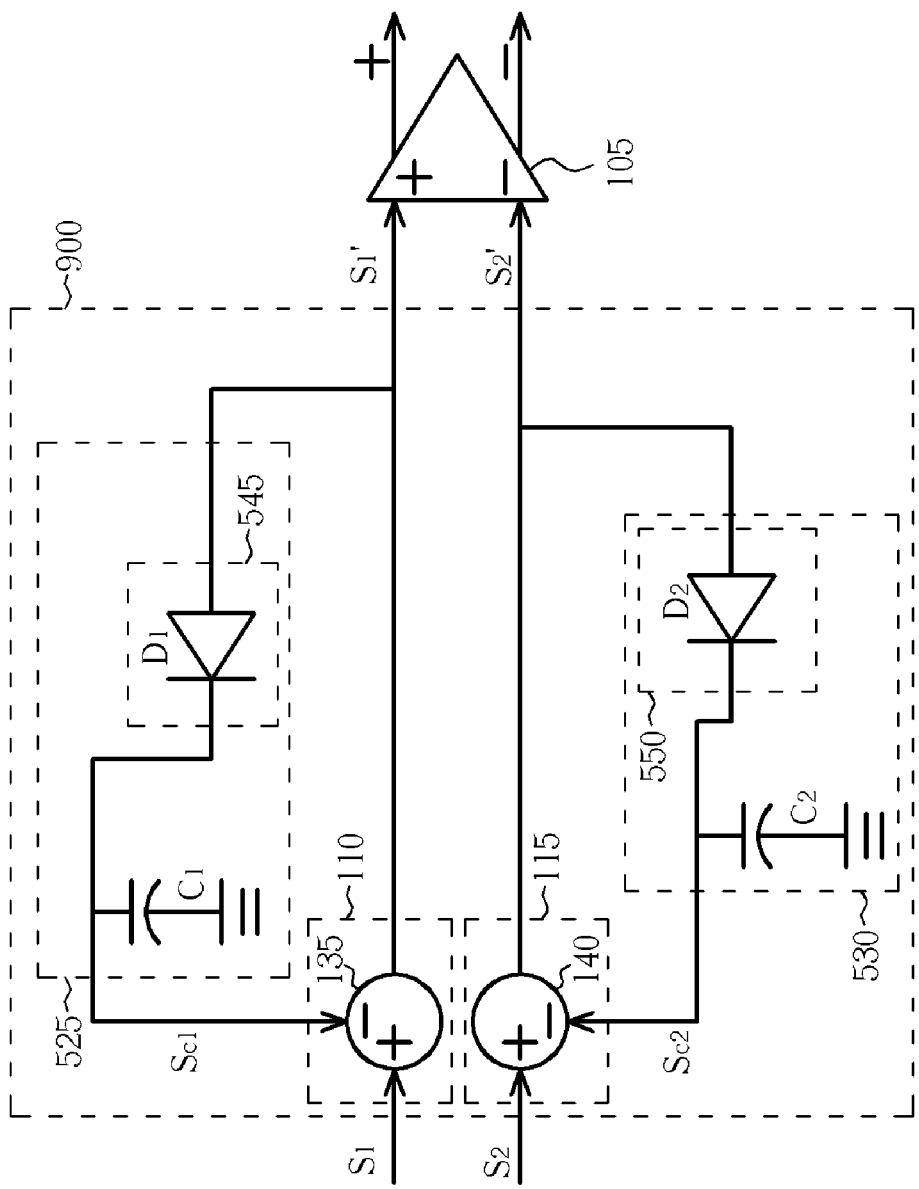
FIG. 9 is a diagram of a DC offset calibration apparatus according to a seventh embodiment of the present invention.
Figure 10:
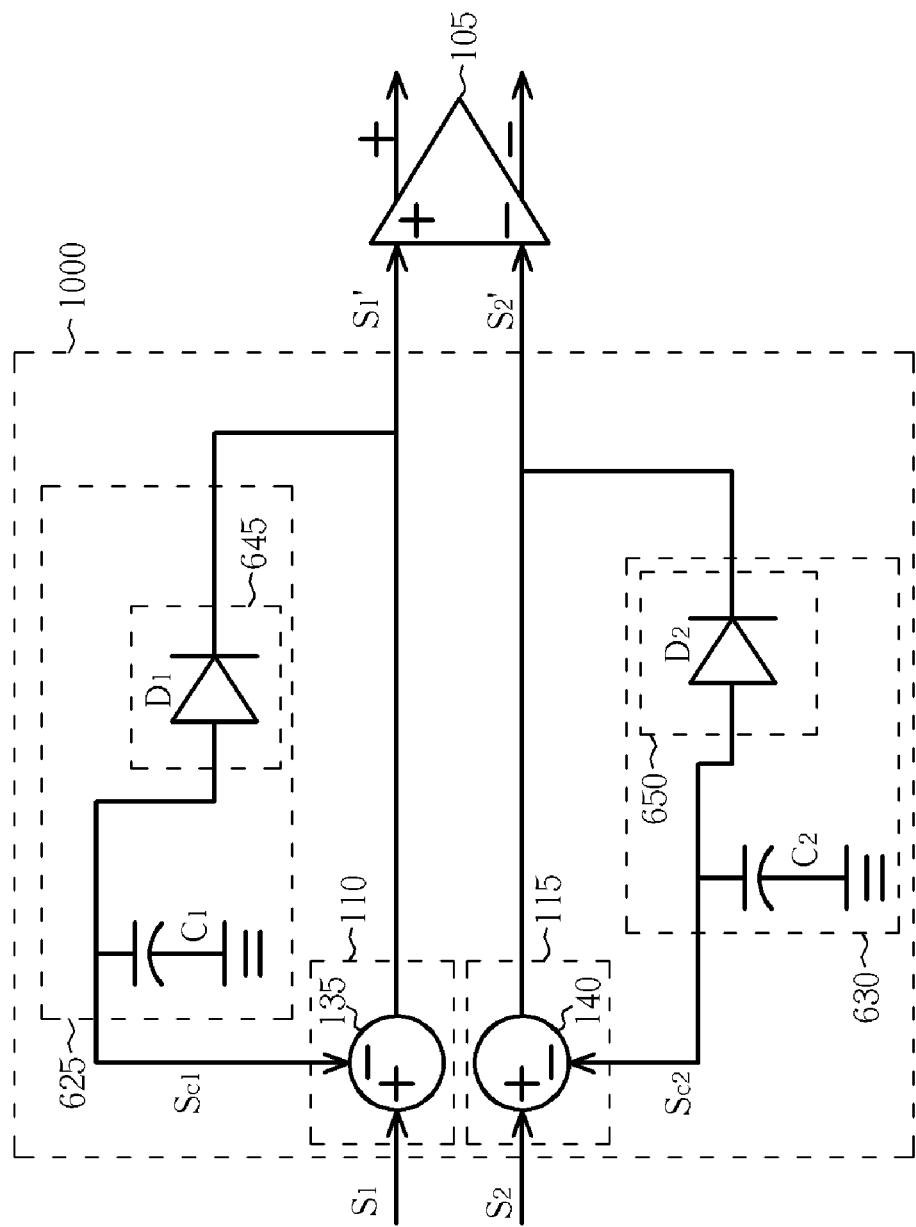
FIG. 10 is a diagram of a DC offset calibration apparatus according to an eighth embodiment of the present invention.

Please refer to FIG. 6. FIG. 6 is a diagram of a DC offset calibration apparatus 600 according to a fourth embodiment of the present invention. In this embodiment, the connection configuration of the diodes $D_1$ and $D_2$ in FIG. 5 is replaced by the connection configuration of the diodes $D_1$ and $D_2$ in FIG. 6; that is, the P-type regions of the diodes $D_1$ and $D_2$ are now coupled to the offset calibration signals $S_{c1}$ and $S_{c2}$, respectively, and the N-type regions of the diodes $D_1$ and $D_2$ are now coupled to the output signals $S_1'$ and $S_2'$, respectively. Hence, when the voltage level of the output signal $S_1'$ is lower than the voltage level of the offset calibration signal $S_{c1}$ and reaches the predetermined threshold voltage difference $V_D$, the diode $D_1$ will become conducted and the capacitor $C_1$ will be discharged through the diode $D_1$ to lower the voltage level of the offset calibration signal $S_{c1}$. When the voltage level of the output signal $S_2'$ is lower than the voltage level of the offset calibration signal $S_{c2}$ and reaches the predetermined threshold voltage difference $V_D$, the diode $D_2$ will become conducted and the capacitor $C_2$ will be discharged through the conducted diode $D_2$ to lower the voltage level of the offset calibration signal $S_{c2}$. Similarly, the DC offset calibration apparatus 600 of this embodiment will co-operate with the differential amplifier circuit 105 having the common-mode feedback path in FIG. 2 to ensure that both the positive signal and the negative signal are calibrated appropriately. Hence, the output signals $S_1'$ and $S_2'$ can be restricted to the same DC offset level, so that erroneous operation will not be observed at later-stage circuitry.

Moreover, if the advantage of the voltage gain provided by the differential amplifier circuit 105 is not necessarily desired, the outputs of the adjustment units 110 and 115 can also be directly fed into the comparators COMP and COMP' or the diodes D and D', and then appropriate predetermined threshold voltage levels $V_{th}$, $V_{th}'$ or appropriate predetermined threshold voltage differences $V_d$ or $V_d'$ can be set to reach the goal of calibrating the DC offsets of the input signals $S_1$ and $S_2$. Please refer to FIG. 7-FIG. 10. After those skilled in the art understand the embodiments in the abovementioned FIG. 1, FIG. 4, FIG. 5, and FIG. 6 and what is illustrated in FIG. 7-FIG. 10, the embodiments in FIG. 7-FIG. 10 can be reduced to practice without undue efforts. Hence, detail description and operational principle are not described herein. Likewise, the DC offset calibration apparatuses in FIG. 7-FIG. 10 will co-operate with the differential amplifier circuit 105 having the common-mode feedback path in FIG. 2 to ensure that both the positive signal and the negative signal are calibrated appropriately. But the differential amplifier circuit 105 here is preferably located in the later-stage circuitry of the DC offset calibration mechanism that is shown in FIG. 7-FIG. 10.

In summary, the abovementioned DC offset calibration device performs the DC offset calibration through the closed loop control only when the voltage levels of the output signals $S_1'$ and $S_2'$ (which can be the signal voltage level before or after the processing of a differential amplifier) satisfy predetermined condition as abovementioned. However, even when the predetermined condition is not satisfied, the voltage levels of the offset calibration signals during the closed loop control will be maintained by the capacitors $C_1$ and $C_2$ having the characteristic of charges buffering. Hence, although at this time the DC offset calibrations are not performed through closed loop control, the DC offset calibrations can still be performed through open loop control. The DC offset calibration apparatus disclosed in the present invention can simultaneously be provided with the advantages of fast speed during the open loop control and undistorted signals during the closed loop control. The present invention is not limited to any specific application, but it is especially suitable for the DC offset of input signals of analog-to-digital converters. At this time, the predetermined threshold value can be designed to be a smaller value than the absolute value of the upper limit or the lower limit of the input dynamic range of the analog-to-digital converter, to make sure that the input signal will fall within the input dynamic range.

Finally it is to be noted that, the abovementioned embodiments of the present invention highlight that the present invention is especially suitable for the differential signal pair having the symmetrical peak amplitude and constant envelope, but the practical applications of the present invention are not limited thereto. Even if the differential signals to be processed do not exactly have the abovementioned specific characteristic, the DC offset calibration apparatuses described in each embodiments of the present invention can bring its calibration effect into full play and still be provided with the advantages of fast speed during the open loop control and undistorted signals during the closed loop control.

Those skilled in the art will readily observe that numerous modifications and alterations of the device and method may be made while retaining the teachings of the invention.

What is claimed is:

1. A DC offset calibration apparatus comprising:
   a first adjustment unit, for receiving a first input signal and a first offset calibration signal and for adjusting the first input signal to generate a first output signal according to the first offset calibration signal;
   a first offset calibration circuit, coupled to the first output signal and the first adjustment unit, for determining the first offset calibration signal according to the first output signal and at least one predetermined threshold value, the first offset calibration circuit comprising:
      a first calibration circuit, coupled to the first output signal, the first calibration circuit comprising:
         a first comparator, for comparing the first output signal with the predetermined threshold voltage level to generate a first control signal; and
         a first transistor, having a first end coupled to a reference voltage, a second end coupled to the first adjustment unit, and a control end coupled to the first comparator, wherein the first control signal controls to turn on the first transistor so as to adjust the voltage level of the first offset calibration signal;
   a second adjustment unit, for receiving a second input signal and a second offset calibration signal and for adjusting the second input signal to generate a second output signal according to the second offset calibration signal; and
   a second offset calibration circuit, coupled to the second output signal and the second adjustment unit, for determining the second offset calibration signal according to the second output signal and the predetermined threshold value, the second offset calibration circuit comprising:
      a second calibration circuit, coupled to the second output signal, the second calibration circuit comprising:
         a second comparator, for comparing the second output signal with the predetermined threshold voltage level to generate a second control signal; and
         a second transistor, having a first end coupled to the reference voltage level, a second end coupled to the second adjustment unit, and a control end coupled to the second comparator, wherein the second control signal controls to turn on the second transistor so as to adjust the voltage level of the second offset calibration signal;

wherein the first input signal and the second input signal are a differential signal pair.

2. The DC offset calibration apparatus of claim 1, wherein:
the first offset calibration circuit adjusts the first offset calibration signal when the first output signal satisfies a first predetermined condition corresponding to the predetermined threshold value; and
the first offset calibration circuit maintains the first offset calibration signal when the first output signal does not satisfy the first predetermined condition.

3. The DC offset calibration apparatus of claim 2, wherein:
the second offset calibration circuit adjusts the second offset calibration signal when the second output signal satisfies a second predetermined condition corresponding to the predetermined threshold value; and
the second offset calibration circuit maintains the second offset calibration signal when the second output signal does not satisfy the second predetermined condition.

4. The DC offset calibration apparatus of claim 3, wherein:
the first offset calibration circuit comprises:
a first capacitor, coupled to the first transistor of the first calibration circuit, for determining a voltage level of the first offset calibration signal, wherein the first control signal of the first calibration circuit controls the first capacitor to perform charging or discharging to adjust the voltage level of the first offset calibration signal; and
the second offset calibration circuit comprises:
a second capacitor, coupled to the second transistor of the second calibration, for determining a voltage level of the second offset calibration signal, wherein the second control signal of the second calibration circuit controls the second capacitor to perform charging or discharging to adjust the voltage level of the second offset calibration signal.

5. The DC offset calibration apparatus of claim 4, wherein:
the predetermined threshold value is a predetermined threshold voltage level;
the first predetermined condition is that a voltage level of the first output signal reaches the predetermined threshold voltage level; and
the second predetermined condition is that a voltage level of the second output signal reaches the predetermined threshold voltage level.

6. The DC offset calibration apparatus of claim 1, wherein a voltage level of the first output signal is confined by the predetermined threshold value, and a voltage level of the second output signal is confined by the predetermined threshold, such that DC levels of both the first output signal and the second output signal are substantially identical to each other.

7. A DC offset calibration method comprising:
receiving a first input signal and a first offset calibration signal and adjusting a voltage level of the first input signal to generate an adjusted first input signal according to a voltage level of the first offset calibration signal;
receiving a second input signal and a second offset calibration signal and adjusting a voltage level of the second input signal to generate an adjusted second input signal according to a voltage level of the second offset calibration signal;
amplifying the adjusted first input signal and the adjusted second input signal to respectively generate a first output signal and a second output signal;

determining the first offset calibration signal by using a first comparator to a gate of a first transistor for comparing the first output signal with at least one predetermined threshold value; and
determining the second offset calibration signal by using a second comparator coupled to a gate of a second transistor for comparing the second output signal with the predetermined threshold value;
wherein the first input signal and the second input signal are a differential signal pair.

8. The DC offset calibration method of claim 7, wherein the step of determining the first offset calibration signal comprises:
adjusting the first offset calibration signal when the first output signal satisfies a first predetermined condition corresponding to the predetermined threshold value; and
maintaining the first offset calibration signal when the first output signal does not satisfy the first predetermined condition.

9. The DC offset calibration method of claim 8, wherein the step of determining the second offset calibration signal comprises:
adjusting the second offset calibration signal when the second output signal satisfies a second predetermined condition corresponding to the predetermined threshold value; and
maintaining the second offset calibration signal when the second output signal does not satisfy the second predetermined condition.

10. The DC offset calibration method of claim 9, wherein:
the step of adjusting the first offset calibration signal comprises:
providing a first capacitor and controlling the first capacitor to perform charging or discharging to adjust a voltage level of the first offset calibration signal; and
the step of adjusting the second offset calibration signal comprises:
providing a second capacitor and controlling the second capacitor to perform charging or discharging to adjust a voltage level of the second offset calibration signal.

11. The DC offset calibration method of claim 10, wherein:
the predetermined threshold value is a predetermined threshold voltage level;
the first predetermined condition is that a voltage level of the first output signal reaches the predetermined threshold voltage level; and
the second predetermined condition is that a voltage level of the second output signal reaches the predetermined threshold voltage level.

12. The DC offset calibration method of claim 10, wherein:
the predetermined threshold value is a predetermined threshold voltage difference;
the first predetermined condition is that a voltage difference between the first output signal and the first offset calibration signal reaches the predetermined threshold voltage difference; and
the second predetermined condition is that a voltage difference between the second output signal and the second offset calibration signal reaches the predetermined threshold voltage difference.

13. The DC offset calibration apparatus of claim 7, wherein a voltage level of the first output signal is confined by the predetermined threshold value, and a voltage level of the second output signal is confined by the predetermined threshold, such that DC level of both the first output signal and the second output signal are substantially identical to each other.

14. A DC offset calibration method comprising:
receiving a differential signal pair having a first input signal and a second input signal;
adjusting a voltage level of the first input signal to generate a first output signal according to a first offset calibration signal;
determining the first offset calibration signal by using a first comparator coupled to a gate of a first transistor for comparing a comparison result of the first output signal with a predetermined threshold value;
adjusting a voltage level of the second input signal to generate a second output signal according to a second offset calibration signal;
determining the second offset calibration signal by using a second comparator coupled to a gate of a second transistor for comparing the second output signal with the predetermined threshold value; and
inputting an output differential signal pair composed of the first output signal and the second output signal to an amplifier circuit, wherein the amplifier circuit comprises a common-mode feedback path for constraining a common-mode voltage of the first output signal and the second output signal to a reference common-mode voltage.

15. The DC offset calibration method of claim 14, wherein:
when the comparison result of the first output signal and the predetermined threshold value is a first state, a closed loop is formed to adjust the voltage level of the first input signal; and
when the comparison result of the first output signal and the predetermined threshold value is a second state, an open loop is formed to adjust the voltage level of the first input signal.

16. The DC offset calibration method of claim 14, wherein the predetermined threshold value is one input of two input ends of a comparator.

17. The DC offset calibration method of claim 16, wherein an output end of the comparator is coupled to a gate of a transistor.

18. The DC offset calibration method of claim 14, wherein the predetermined value is determined by turn-on voltages of at least one diode.

19. The DC offset calibration method of claim 14, wherein a voltage level of the first output signal is confined by the predetermined threshold value, and a voltage level of the second output signal is confined by the predetermined threshold, such that DC levels of both the first output signal and the second output signal are substantially identical to each other.

20. A DC offset calibration apparatus comprising:
a first adjustment unit, for receiving a first input signal and a first offset calibration signal and for adjusting the first input signal to generate a first output signal according to the first offset calibration signal;
a first offset calibration circuit, coupled to the first output signal and the first adjustment unit, for determining the first offset calibration signal according to the first output signal and at least one predetermined threshold value, the first offset calibration circuit comprising:
a first calibration circuit, coupled to the first output signal, the first calibration circuit comprising:
a first diode unit, comprising at least one diode, wherein a first connecting end of the first diode unit is coupled to the first output signal and a second connecting end of the first diode unit is coupled to the first adjustment unit;
a second adjustment unit, for receiving a second input signal and a second offset calibration signal and for adjusting the second input signal to generate a second output signal according to the second offset calibration signal; and
a second offset calibration circuit, coupled to the second output signal and the second adjustment unit, for determining the second offset calibration signal according to the second output signal and the predetermined threshold value, the second offset calibration circuit comprising:
a second calibration circuit, coupled to the second output signal, the second calibration circuit comprising:
a second diode unit comprising at least one diode, wherein a first connecting end of the second diode unit is coupled to the second output signal and a second connecting end of the second diode unit is coupled to the second adjustment unit;
wherein the first input signal and the second input signal are a differential signal pair.

21. The DC offset calibration apparatus of claim 20, wherein:
the first offset calibration circuit adjusts the first offset calibration signal when the first output signal satisfies a first predetermined condition corresponding to the predetermined threshold value; and
the first offset calibration circuit maintains the first offset calibration signal when the first output signal does not satisfy the first predetermined condition.

22. The DC offset calibration apparatus of claim 21, wherein:
the second offset calibration circuit adjusts the second offset calibration signal when the second output signal satisfies a second predetermined condition corresponding to the predetermined threshold value; and
the second offset calibration circuit maintains the second offset calibration signal when the second output signal does not satisfy the second predetermined condition.

23. The DC offset calibration apparatus of claim 22, wherein:
the first offset calibration circuit comprises:
a first capacitor, coupled to the second connecting end of the first diode unit, for determining a voltage level of the first offset calibration signal; and
the second offset calibration circuit comprises:
a second capacitor, coupled to the second connecting end of the second diode unit, for determining a voltage level of the second offset calibration signal.

24. The DC offset calibration apparatus of claim 23, wherein:
the predetermined threshold value is a predetermined threshold voltage difference;
the first predetermined condition is that a voltage difference between the first output signal and the first offset calibration signal reaches the predetermined threshold voltage difference; and
the second predetermined condition is that a voltage difference between the second output signal and the second offset calibration signal reaches the predetermined threshold voltage difference.

25. The DC offset calibration method of claim 20, wherein a voltage level of the first output signal is confined by the predetermined threshold value, and a voltage level of the second output signal is confined by the predetermined threshold, such that DC levels of both the first output signal and the second output signal are substantially identical to each other.

26. A DC offset calibration method comprising:
receiving a differential signal pair having a first input signal and a second input signal;

adjusting a voltage level of the first input signal to generate a first output signal according to a first offset calibration signal;

determining the first offset calibration signal according to a comparison result of the first output signal and a predetermined threshold value using at least a first diode;

adjusting a voltage level of the second input signal to generate a second output signal according to a second offset calibration signal;

determining the second offset calibration signal according to a comparison result of the second output signal and the predetermined threshold value using at least a second diode; and inputting an output differential signal pair composed of the first output signal and the second output signal to an amplifier circuit;

wherein the predetermined value is determined by turn-on voltages of said at least a first diode and said at least a second diode.

27. The DC offset calibration method of claim 26, wherein a voltage level of the first output signal is confined by the predetermined threshold value, and a voltage level of the second output signal is confined by the predetermined threshold, such that DC levels of both the first output signal and the second output signal are substantially identical to each other.

* * * * *